United States Patent [19]
Lin et al.

[11] Patent Number: 6,015,741
[45] Date of Patent: Jan. 18, 2000

[54] METHOD FOR FORMING SELF-ALIGNED CONTACT WINDOW

[75] Inventors: Tony Lin, Kaohsiung Hsien; Water Lur; Shih-Wei Sun, both of Taipei, all of Taiwan

[73] Assignee: United Microelectronics Corp., Hsin-chu, Taiwan

[21] Appl. No.: 09/059,428

[22] Filed: Apr. 13, 1998

[30] Foreign Application Priority Data

Feb. 3, 1998 [TW] Taiwan .................................. 87101265

[51] Int. Cl.7 ................................................ H01L 21/44
[52] U.S. Cl. ........................ 438/305; 438/533; 438/621; 438/639; 438/683; 438/586
[58] Field of Search .................... 438/299, 303, 438/305, 514, 517, 527, 533, 621, 637, 639, 683, 664, 634, 586

[56] References Cited

U.S. PATENT DOCUMENTS

| | | | |
|---|---|---|---|
| 4,855,247 | 8/1989 | Ma et al. ................................ | 438/305 |
| 5,037,777 | 8/1991 | Mele et al. ................................ | 438/632 |
| 5,352,631 | 10/1994 | Sitaram et al. ........................ | 438/300 |
| 5,763,311 | 6/1998 | Gardner et al. ........................ | 438/286 |
| 5,770,507 | 6/1998 | Chen et al. ............................. | 438/305 |
| 5,783,475 | 7/1998 | Ramaswami ............................ | 438/303 |
| 5,851,890 | 12/1998 | Tsai et al. ................................ | 438/303 |

*Primary Examiner*—Wael Fahmy
*Assistant Examiner*—Kurt Eaton
*Attorney, Agent, or Firm*—Christie, Parker & Hale, LLP

[57] ABSTRACT

A method for forming a self-aligned contact window such that the method is compatible with the process of forming a self-aligned titanium silicide layer on the same device, and hence capable of miniaturizing device dimensions. Furthermore, this invention utilizes the thicker etching stop layer thickness above the gate region than above the source/drain region to protect the titanium silicide layer in the gate region against electrical contact with the self-aligned contact.

13 Claims, 4 Drawing Sheets

METHOD FOR FORMING SELF-ALIGNED CONTACT WINDOW

CROSS-REFERENCE TO RELATED APPLICATION

This application claims the priority benefit of Taiwan application Ser. No. 87101265, filed Feb. 3, 1998 the full disclosure of which is incorporated herein by reference.

BACKGROUND OF THE INVENTION

1. Field of Invention

The present invention relates to a method for forming self-aligned contact window. More particularly, the present invention relates to a method for forming a self-aligned contact window that allows a self-aligned silicide process and a self-aligned contact process to be run on the same device.

2. Description of Related Art

In today's ultra large-scale integrated circuit fabrication, devices have now shrunk to sub-quarter micron dimensions. As device dimensions continue to shrink, the application of self-aligned silicide material and the forming of self-aligned contact (SAC) window are methods for saving device areas. Since a contact window opening is formed on the surface of a gate region in a self-aligned contact process, the top surface of the gate region must be covered by an insulating layer to prevent any electrical contact with the contact window. Because an insulating layer such as silicon nitride is difficult to form over a silicide layer other than a tungsten silicide layer, the gate must be covered by a tungsten silicide layer thereby limiting the use of a conventional self-aligned contact process.

FIGS. 1A through 1C are cross-sectional views showing the progression of manufacturing steps in forming a conventional self-aligned contact window. First, as shown in FIG. 1A, a substrate 10 is provided. Then, a polysilicon layer 11, a tungsten silicide layer 12 and a silicon nitride layer 13 are sequentially formed over the substrate 10. The purpose of the silicon nitride layer 13 is for preventing the tungsten silicide layer 12 from making contact with other conductive layers. Thereafter, the silicon nitride layer 13, the tungsten silicide layer 12 and the polysilicon layer 11 are patterned to define a gate region 14. The gate region 14 comprises of the polysilicon layer 11 and the tungsten silicide layer 12. Next, using the silicon nitride 13 and the gate region 14 as a mask, ions are implanted into the substrate 10 forming lightly doped drain (LDD) regions.

Thereafter, as shown in FIG. 1B, spacers 16 are formed on the sidewalls of the gate region 14 and the silicon nitride layer 13. The spacers 16 are formed, for example, by first forming a silicon nitride layer over the substrate surface 10, and then performing an anisotropic etching back operation. Next, using the spacers 16 and the silicon nitride layer 13 as a mask, ions are again implanted into the substrate 10 to form the source/drain regions 17.

Next, as shown in FIG. 1C, a dielectric layer such as a silicon dioxide layer is formed over the substrate 10 using, for example, a chemical vapor deposition method. Thereafter, the dielectric layer 18 is patterned to define a contact window 19 exposing the source/drain region 17, the spacer 16 and a portion of the silicon nitride layer 13. Due to the presence of a silicon nitride layer 13 over the gate region 14, when the dielectric layer 18 is etched to form the contact window 19, the silicon nitride layer 13 can act as an etching stop layer. Hence, electrical contact between the contact window 19 and the gate region 14 is prevented.

The aforementioned conventional method of forming a self-aligned contact is only suitable for gate region having a tungsten silicide on top. The reason for this is that the quality of a silicon nitride deposition is good only when the underlying layer is tungsten silicide. The deposition of a silicon nitride layer over a titanium silicide layer is unsatisfactory. Consequently, when a self-aligned titanium silicide layer has already formed over the device, it will be very difficult to form a silicon nitride layer that acts as an etching stop layer over the titanium silicide layer by a conventional method. Therefore, using a self-aligned silicide process to form a self-aligned titanium layer is incompatible with using a conventional self-aligned contact process to form a self-aligned contact on the same device for reducing device occupational area.

In light of the foregoing, there is a need to provide an improved method for forming a self-aligned contact.

SUMMARY OF THE INVENTION

Accordingly, the present invention is to provide a method for forming a self-aligned contact window that is compatible with using a self-aligned silicide process to form a self-aligned titanium layer on the same device, and hence capable of reducing the occupational area of the device.

In another aspect, the invention provides a method for forming a self-aligned contact that utilizes a thick silicon nitride layer formed on the surface of a gate region and a thin silicon nitride layer formed on the surface of a source/drain region. With their difference in thickness, the thicker silicon nitride layer over the surface of the gate region can ultimately act as an etching stop layer preventing electrical contact between the contact window and the gate region.

To achieve these and other advantages and in accordance with the purpose of the invention, as embodied and broadly described herein, the invention provides a method for forming a self-aligned contact comprising the steps of providing a substrate, and then forming sequentially a polysilicon layer and a first dielectric layer; patterning the first dielectric layer and the polysilicon layer to form a gate region; forming an oxide layer over the substrate; implanting ions into the substrate using the gate region as a mask to form a plurality of lightly doped drain regions; forming an insulating layer over the oxide layer; removing the insulating layer and the oxide layer using an anisotropic etching back operation and forming spacers on the sidewalls of the gate region; implanting ions into the substrate using the spacers and the gate region as a mask to form source/drain regions; removing the first dielectric layer; forming a self-aligned metal silicide over the source/drain regions and the gate region; forming an etching stop layer over the source/drain regions and the gate region; forming a second dielectric layer over the etching stop layer; and, patterning the second dielectric layer and the etching stop layer to form a self-aligned contact exposing the source/drain region and the etching stop layer above the gate region.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
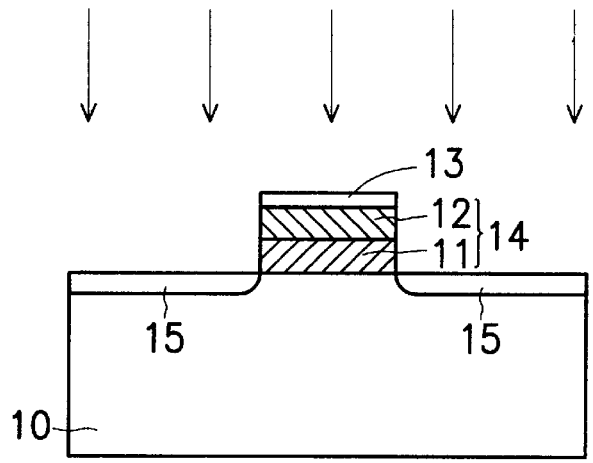
FIGS. 1A through 1C are cross-sectional views showing the progression of manufacturing steps in forming a conventional self-aligned contact window.
Figure 1B:
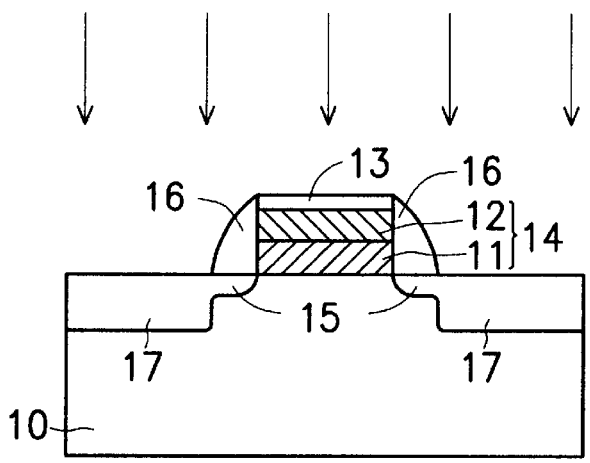
Figure 1C:
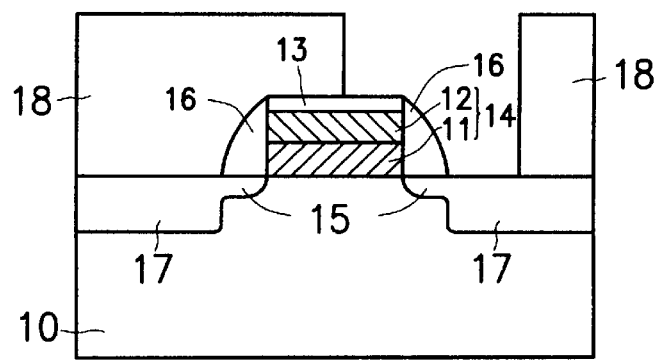

Reference will now be made in detail to the present preferred embodiments of the invention, examples of which are illustrated in the accompanying drawings. Wherever possible, the same reference numbers are used in the drawings and the description to refer to the same or like parts.

Figure 2A:
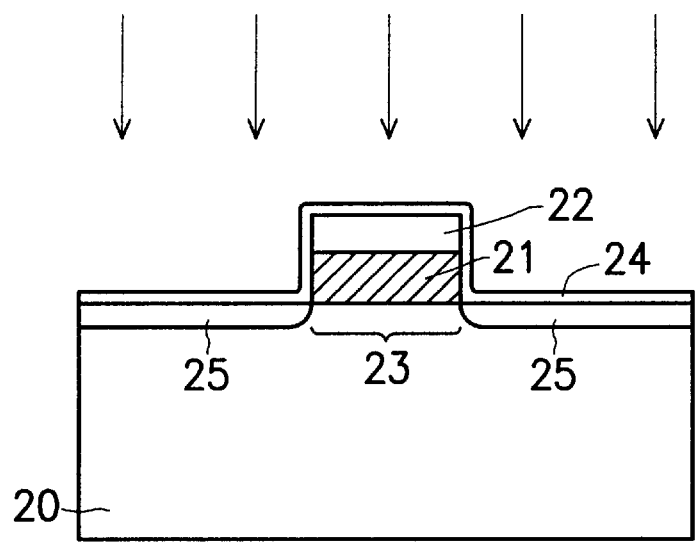
FIGS. 2A through 2F are cross-sectional views showing the progression of manufacturing steps in forming a self-aligned contact window according to one preferred embodiment of this invention.

FIGS. 2A through 2F are cross-sectional views showing the progression of manufacturing steps in forming a self-aligned contact window according to one preferred embodiment of this invention. First, as shown in FIG. 2A, a substrate 20 is provided. Then, a polysilicon layer 21 and a dielectric layer 22 are sequentially formed over the substrate 20. The dielectric layer preferably having a thickness of about 300 Å to 500 Å can be formed from a material such as silicon dioxide or silicon-oxy-nitride (SiNO) compound. Thereafter, the dielectric layer 22 and the polysilicon layer 21 are patterned to form a polysilicon gate region 23. Subsequently, an oxide layer preferably having a thickness of about 300 Å to 500 Å is formed over the substrate 10 using, for example, a chemical vapor deposition method. Finally, ions are implanted into the substrate 10 to form lightly doped drain regions 25.

Figure 2B:
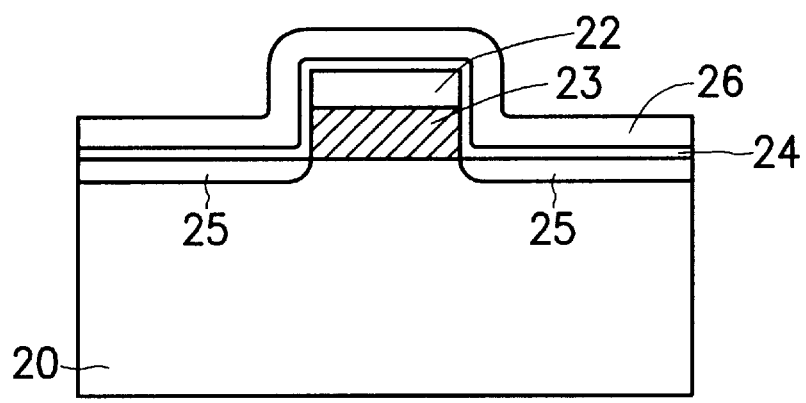
Figure 2C:
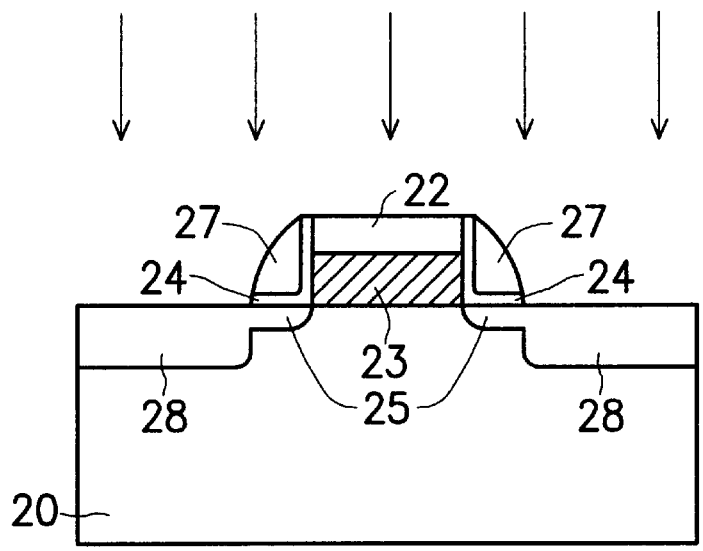

Next, as shown in FIG. 2B, an insulating layer 26 is formed over the oxide layer 24. The insulating layer 26 can be a silicon dioxide or a silicon nitride layer, for example. If the dielectric layer 22 is formed from silicon-oxy-nitride compound, a silicon dioxide insulating layer is used. On the other hand, if the dielectric layer 22 is a silicon dioxide layer, the insulating layer 26 is a silicon nitride layer. In the subsequent step, the insulating layer 26 is anisotropically etched back to form spacers 27 on the sidewalls of the gate region 23 as well as to remove the oxide layer 24. Thereafter, using the spacers 27 and the gate region 23 as a mask, ions are implanted into the substrate again to form source/drain regions 28 as shown in FIG. 2C.

Figure 2D:
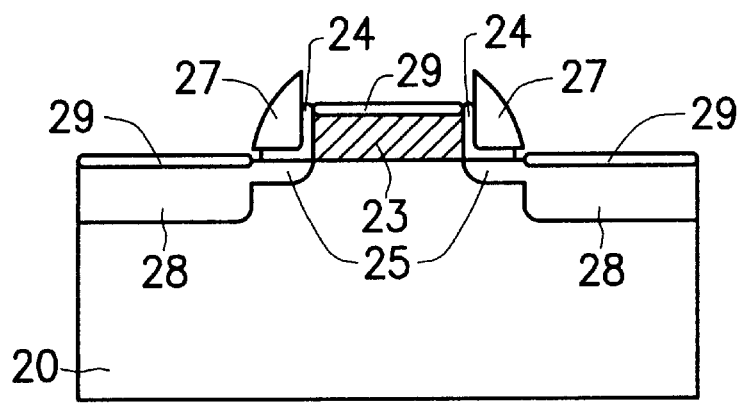

Next, as shown in FIG. 2D, the dielectric layer 22 is removed using, for example, a wet etching or a dry etching method. Consequently, the upper parts of the sidewall spacers 27 are at a level higher than the gate region 23 forming a trench-like structure in the gate. After that, a titanium silicide layer 29 is formed over the source/drain regions 28 and the gate region 23. The titanium silicide layer 29 is formed, for example, by first depositing a titanium layer over the source/drain region and the gate region, then performing a rapid thermal processing operation, and finally removing the unreacted titanium layer.

Figure 2E:
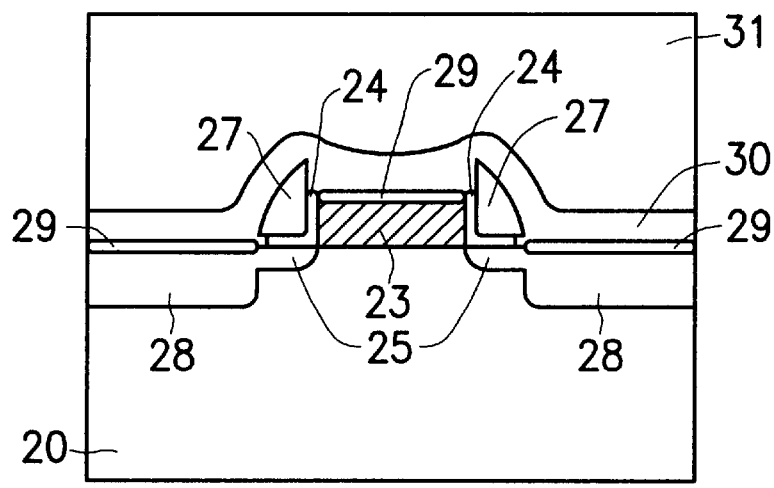

Subsequently, as shown in FIG. 2E, an etching stop layer 30, for example, a silicon nitride layer, is formed over the titanium silicide layer 29 that lies above the substrate 10. Since the gate region has a trench-like structure above it, the deposited etching stop layer 30 will have a greater thickness above the gate region 23 than the source/drain regions 28. Thereafter, a dielectric layer 31, for example, a borophosphosilicate glass layer, is formed over the etching stop layer 31.

Figure 2F:
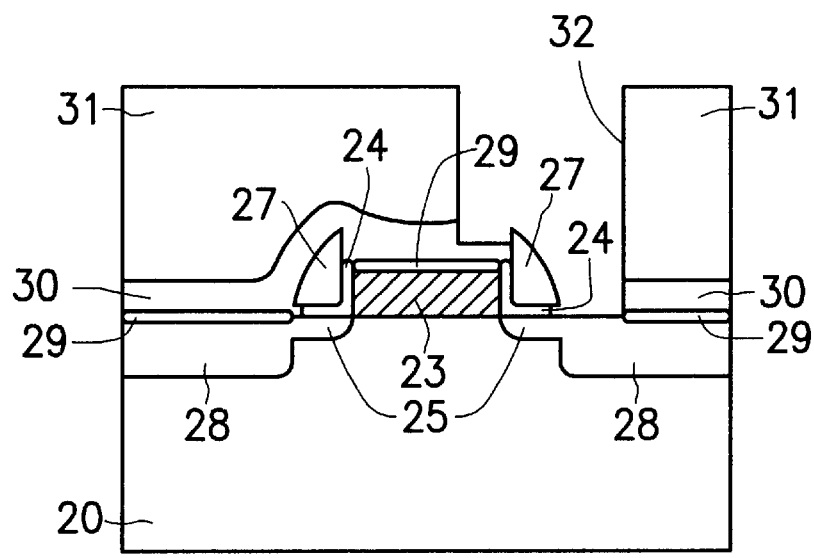

Finally, as shown in FIG. 2F, the dielectric layer 31 and the etching stop layer 30 are patterned to form a self-aligned contact window 32 exposing the source/drain region 28. Because the etching stop layer 30 above the gate region 23 is thicker than the same layer above the source/drain region 28, when the etching stop layer 30 above the source/drain region is completely etched, a certain thickness of the etching stop layer 30 above the gate region 23 still remains. The etching stop layer 30 remaining above the gate can act as a layer for isolating the gate region 23 and the contact window 32, thus preventing any leakage current from passing through. Thereafter, conventional processes necessary for the completion of the self-aligned contact production is performed, detailed descriptions are omitted here.

As a summary, this invention utilizes the thicker etching stop layer above the gate region than the same etching stop layer above the source/drain region. The extra thickness in the etching stop layer above the gate region is able to protect the titanium silicide layer against electrical contact with the self-aligned contact window. Therefore, in this invention, a self-aligned silicide process to form a titanium silicide layer is compatible with a self-aligned contact process to form a contact window on the same device.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for forming a self-aligned contact window comprising:

providing a substrate, and then forming sequentially a polysilicon layer and a first dielectric layer;

patterning the first dielectric layer and the polysilicon layer to form a gate region;

forming an oxide layer over the substrate;

implanting ions into the substrate using the gate region as a mask to form a plurality of lightly doped drain regions;

forming an insulating layer over the oxide layer;

removing the insulating layer and the oxide layer using an anisotropic etching back operation and forming spacers on the sidewalls of the gate region;

implanting ions into the substrate using the spacers and the gate region as a mask to form source/drain regions;

removing the first dielectric layer;

forming a self-aligned metal silicide over the source/drain regions and the gate region;

forming an etching stop layer over the source/drain regions and the gate region;

forming a second dielectric layer over the etching stop layer; and patterning the second dielectric layer and the etching stop layer to form a self-aligned contact window exposing the source/drain region and the etching stop layer above the gate region.

2. The method of claim 1, wherein the first dielectric layer includes silicon-oxy-nitride compound, and the insulating layer includes silicon dioxide.

3. The method of claim 1, wherein the first dielectric layer includes silicon dioxide, and the insulating layer includes silicon nitride.

4. The method of claim 1, wherein the first dielectric layer has a thickness of about 300 Å to 500 Å.

5. The method of claim 1, wherein the step of forming the oxide layer includes a chemical vapor deposition method, and the oxide layer has a thickness of about 300 Å to 500 Å.

6. The method of claim 1, wherein the step of removing the first dielectric layer includes a dry etching method.

7. The method of claim 1, wherein the step of removing the first dielectric layer includes a wet etching method.

8. The method of claim 1, wherein the self-aligned silicide layer includes titanium silicide.

9. The method of claim 8, wherein the step of forming the self-aligned silicide layer further includes:

forming a titanium layer over the substrate;

performing a rapid thermal processing operation so that titanium in the titanium layer reacts with silicon on the surface of the substrate and the gate region to form titanium silicide; and removing the unreacted titanium layer.

10. The method of claim 1, wherein the etching stop layer includes silicon nitride.

11. The method of claim 1, wherein the etching stop layer deposited over the gate region is thicker than the etching stop layer deposited over the source/drain region.

12. The method of claim 1, wherein the second dielectric layer includes borophosphosilicate glass.

13. A method for forming a self-aligned contact window comprising:

providing a substrate;

sequentially forming a polysilicon layer and a first dielectric layer;

patterning the first dielectric layer and the polysilicon layer to form a gate region;

forming an oxide layer over the first dielectric layer and the polysilicon layer;

implanting ions into the substrate using the gate region as a mask to form a plurality of lightly doped drain regions;

forming an insulating layer over the oxide layer;

removing the insulating layer and the oxide layer using an anisotropic etching back operation and forming spacers on the sidewalls of the gate region;

implanting ions into the substrate using the spacers and the gate region as a mask to form source/drain regions;

removing only the first dielectric layer and a portion of the oxide layer so that the oxide layer has a height equal to that of the polysilicon layer;

forming a self-aligned metal silicide over the source/drain regions and the gate region;

forming an etching stop layer over the source/drain regions and the gate region;

forming a second dielectric layer over the etching stop layer; and patterning the second dielectric layer and the etching stop layer to form a self-aligned contact window exposing the source/drain region and the etching stop layer above the gate region.

* * * * *